US006851467B1

(12) United States Patent
Bamford et al.

(10) Patent No.: US 6,851,467 B1
(45) Date of Patent: Feb. 8, 2005

(54) HEAT SINK ASSEMBLY

(75) Inventors: William C. Bamford, Clarendon Hill, IL (US); Blaine C. Wotring, Derry, NH (US); Gregory T. Wyler, Manchester, MA (US)

(73) Assignee: Molex Incorporated, Lisle, IL (US)

( * ) Notice: Subject to any disclaimer, the term of this patent is extended or adjusted under 35 U.S.C. 154(b) by 580 days.

(21) Appl. No.: 09/386,103

(22) Filed: Aug. 30, 1999

(51) Int. Cl.$^7$ ................................................ H05K 2/20
(52) U.S. Cl. .................. 165/80.3; 165/120; 165/185; 361/697
(58) Field of Search ................... 165/80.3, 185

(56) References Cited

U.S. PATENT DOCUMENTS

| | | | | |
|---|---|---|---|---|
| 2,161,417 A | * | 6/1939 | Holmes ...................... | 165/185 |
| 2,396,216 A | * | 3/1946 | Vang ........................... | 165/185 |
| 2,413,179 A | * | 12/1946 | Grandmont et al. ........ | 165/185 |
| 3,152,217 A | * | 10/1964 | Balchaitis ............... | 165/80.3 X |
| 3,185,756 A | * | 5/1965 | Allison ....................... | 165/185 |
| 3,187,082 A | * | 6/1965 | Allison ....................... | 165/185 |
| 3,213,336 A | | 10/1965 | McAdam .................... | 317/234 |
| 3,239,003 A | | 3/1966 | Boudette et al. ............ | 165/185 |
| D205,770 S | | 9/1966 | Coe | |
| 3,280,907 A | | 10/1966 | Hoffman ..................... | 165/185 |
| 3,372,733 A | * | 3/1968 | Callender ................... | 165/185 |
| 3,422,777 A | | 1/1969 | Plegat | |
| 3,566,958 A | | 3/1971 | Zelina .......................... | 165/80 |
| 4,607,685 A | * | 8/1986 | Mitchell, Jr. ................ | 165/80.3 |
| 4,682,651 A | | 7/1987 | Gabuzda ..................... | 165/80.3 |
| 4,715,438 A | | 12/1987 | Gabuzda et al. ............ | 165/185 |
| 4,716,494 A | | 12/1987 | Bright et al. ................ | 361/386 |
| 4,733,293 A | | 3/1988 | Gabuzda ...................... | 357/81 |
| 4,753,290 A | | 6/1988 | Gabuzda ..................... | 165/185 |
| 5,019,880 A | | 5/1991 | Higgins, III. | |
| 5,597,034 A | | 1/1997 | Barker, III et al. ........ | 165/80.3 |
| 5,704,416 A | | 1/1998 | Larson et al. | |
| 5,782,292 A | | 7/1998 | Ogawara et al. ........... | 165/80.3 |
| 5,785,116 A | | 7/1998 | Wagner ..................... | 165/80.3 |
| 5,794,685 A | | 8/1998 | Dean .......................... | 165/121 |
| 5,828,551 A | | 10/1998 | Hoshino et al. ............ | 361/697 |
| 5,910,694 A | | 6/1999 | Yokozawa et al. ............ | 310/89 |
| 5,927,385 A | | 7/1999 | Yeh .............................. | 165/80.3 |

FOREIGN PATENT DOCUMENTS

| | | | | |
|---|---|---|---|---|
| DE | 44339 | * | 5/1908 | ................. 165/185 |
| DE | 1188208 | * | 3/1965 | ................. 165/185 |
| EP | 0 809 287 A1 | | 11/1997 | |
| JP | 59089443 | | 5/1984 | |

* cited by examiner

*Primary Examiner*—Allen Flanigan
(74) *Attorney, Agent, or Firm*—Robert J. Zeitler

(57) ABSTRACT

A heat sink assembly includes a heat exchanging section formed by a thermally conductive sheet folded into alternating ridges and troughs defining generally parallel spaced fins having opposite end edges. The folded sheet is formed into a generally cylindrical configuration whereby the troughs form an inner segmented cylinder and the ridges form an outer segmented cylinder generally concentric with the inner cylinder. The heat sink assembly may include a heat conductive rod dimensioned to engage the troughs of the thermally conductive sheet. The ridges of the thermally conductive sheet may also contain apertures to allow air to fully circulate through the fins. The heat sink assembly may also include a fan and a thermally conductive base plate.

29 Claims, 3 Drawing Sheets

HEAT SINK ASSEMBLY

FIELD OF THE INVENTION

This invention generally relates to cooling devices such as heat exchangers and, particularly, to a heat sink assembly having an improved heat exchanger arrangement.

BACKGROUND OF THE INVENTION

In various industries, such as in the computer industry, there is a need for low cost high performance heat exchangers to cool such components as microprocessors or semiconductors. Many semiconductors create so much heat that they can be irreparably damaged if the heat is not removed. Consequently, heat exchangers employing heat sinks have been used to pull the heat away from the semiconductor and disperse that heat into the atmosphere. The present invention is directed to improvements in such heat sink assemblies.

SUMMARY OF THE INVENTION

An object, therefore, of the invention is to provide a new and improved heat sink assembly of the character described.

In one embodiment of the invention, the heat sink assembly used to dissipate heat from a heat producing electronic device includes a heat exchanging section having a thermally conductive sheet folded into alternating ridges and troughs defining generally parallel spaced fins having opposite end edges. The folded sheet is formed into a generally cylindrical configuration, whereby the troughs form an inner segmented cylinder and the ridges form an outer segmented cylinder generally concentric with the inner cylinder. The heat exchanging section is in thermal contact with a heat producing device via a thermally conductive path which is thermally connected to at least one of the troughs of the fins.

The invention contemplates that the assembly may include a cylindrical heat conductive rod within the inner segmented cylinder defined by the troughs of the folded sheet. The rod is dimensioned for engaging the troughs, and the fins are generally parallel to the rod. The rod may be hollow, solid or comprise a fluid filled heat pipe.

The heat sink assembly is shown as part of a heat exchanger assembly including a fan mounted on the heat exchanging section at an end thereof opposite the heat producing electronic device. The end edges of the fins adjacent the heat producing electronic device are spaced from the heat producing electronic device so that the fan can circulate cooling air completely through the heat exchanging section. Alternatively, in situations where the overall length of the heat sink assembly is a design driver, apertures can be place in the ridges of the fins so that the end edges of the fins can be placed on the heat producing electronic device, with the apertures in the ridges of the fins allowing air to circulate fully through the heat exchanging section.

The invention may also have a thermally conductive base plate at an end opposite the fan.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
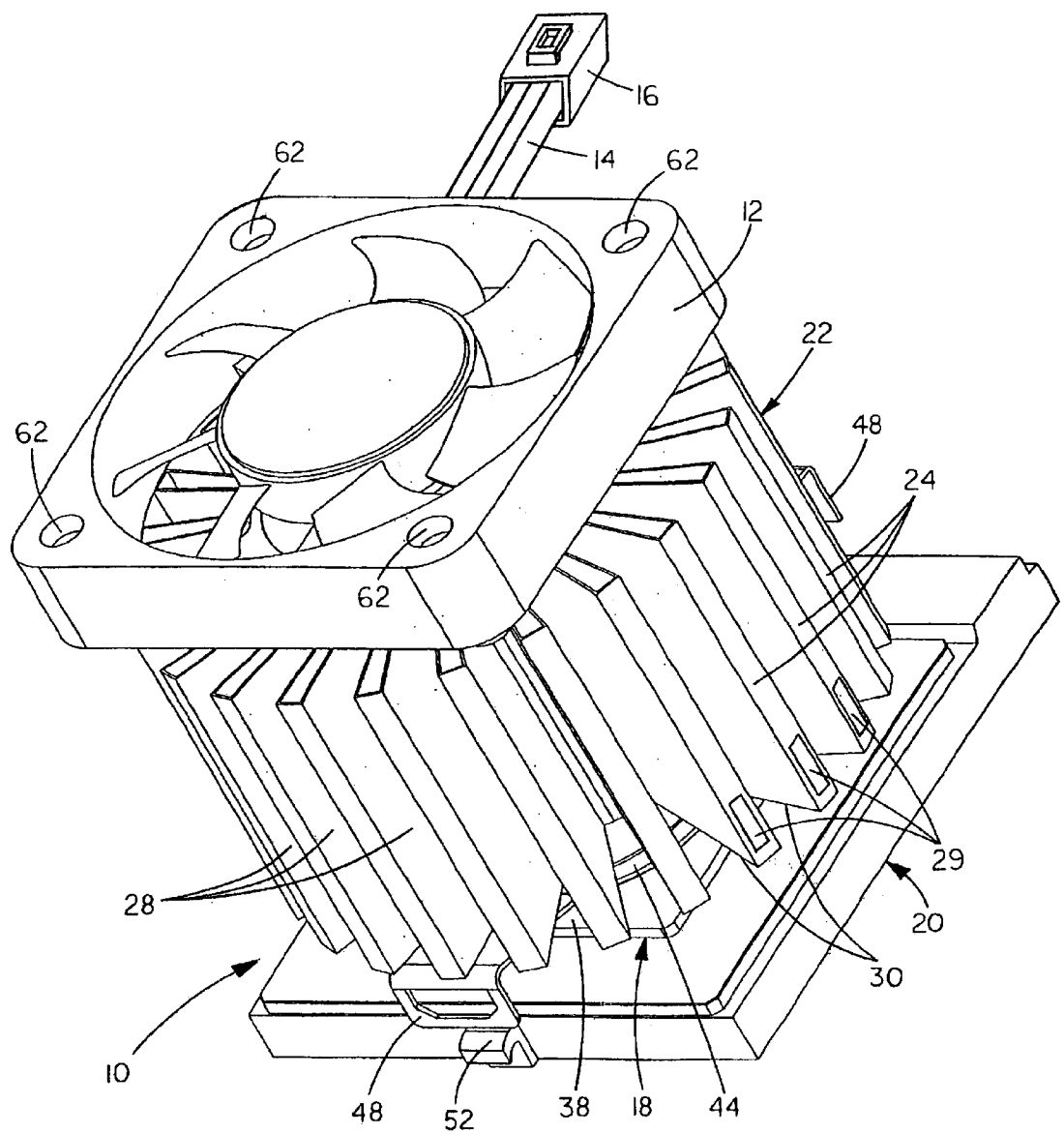
FIG. 1 is a top perspective view of a heat exchanger assembly incorporating the heat sink assembly of the invention.

Referring to the drawings in greater detail, one embodiment of the invention is incorporated in a heat sink assembly, generally designated 10, which includes a circular fan assembly 12 having lead wires 14 extending therefrom and terminating in an electrical connector 16. The fan assembly is mounted on top of a heat exchanging section, generally designated 18. The heat exchanging section, in turn, is mounted above a base assembly, generally designated 20.

Figure 2:
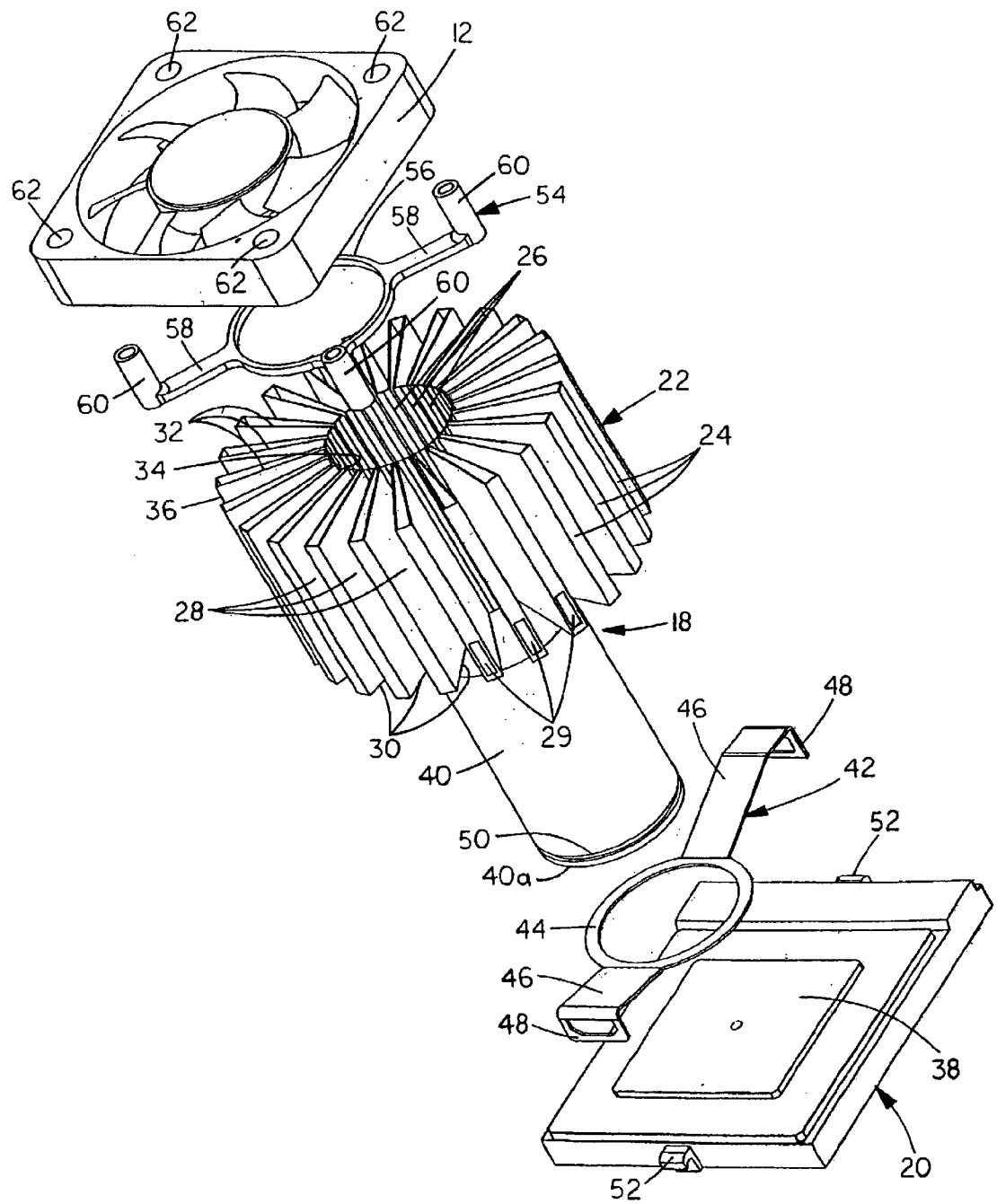
FIG. 2 is an exploded perspective view of the heat exchanger assembly of FIG. 1.

More particularly, heat exchanging section 18 includes a thermally conductive sheet, generally designated 22, which is folded into alternating ridges 24 and troughs 26 defining generally parallel spaced fins 28 having opposite end edges 30 and 32. Folded sheet 22 is formed into a generally cylindrical configuration as best seen in FIG. 2, whereby troughs 26 form an inner segmented cylinder 34 and ridges 24 form an outer segmented cylinder 36 generally concentric with inner cylinder 34. The inner and outer cylinders are "segmented" because they are not defined by continuously smooth surfaces, therefore allowing air to circulate to or from the side of fins 28. In other words, ridges 24 and troughs 26 form axially extending circumferentially spaced segments of the cylinders. The ridges 24 may also include apertures 29 to allow air contained inside the fins 28 to escape in those instances where the end edge 30 of the fins 28 are in direct contact with the heat producing electronic device 38, or in those instances where additional air escape paths are desired to meet the required cooling requirements of the system.

Heat sink assembly 10 also includes a cylindrical heat conductive rod 40 disposed within inner segmented cylinder 34 defined by troughs 26 of heat exchanging section 22. It can be seen in FIG. 2 that the rod has a greater diameter than inner segmented cylinder 34. When the rod is inserted into the cylinder within the inside of heat exchanging section 22, the folded sheet of the section expands in an accordion-like fashion, whereby troughs 34 are biased into engagement with the outer cylindrical surface of rod 40. In other words, the folded sheet which forms heat exchanging section 22 sort of grips the rod to provide good heat conductivity therebetween. The rod may be a solid structure, a hollow structure or may comprise a fluid filled heat pipe. Alternatively, the diameter of the rod 40 may be the same as the diameter of the inner segmented cylinder 34, with the inner segmented cylinder 34 being affixed to the rod with any known means of affixing two items together, such as an epoxy material or a clamping device (not shown). In the preferred embodiment, the rod 40 is in direct contact with the heat generating electronic device 38.

Figure 3:
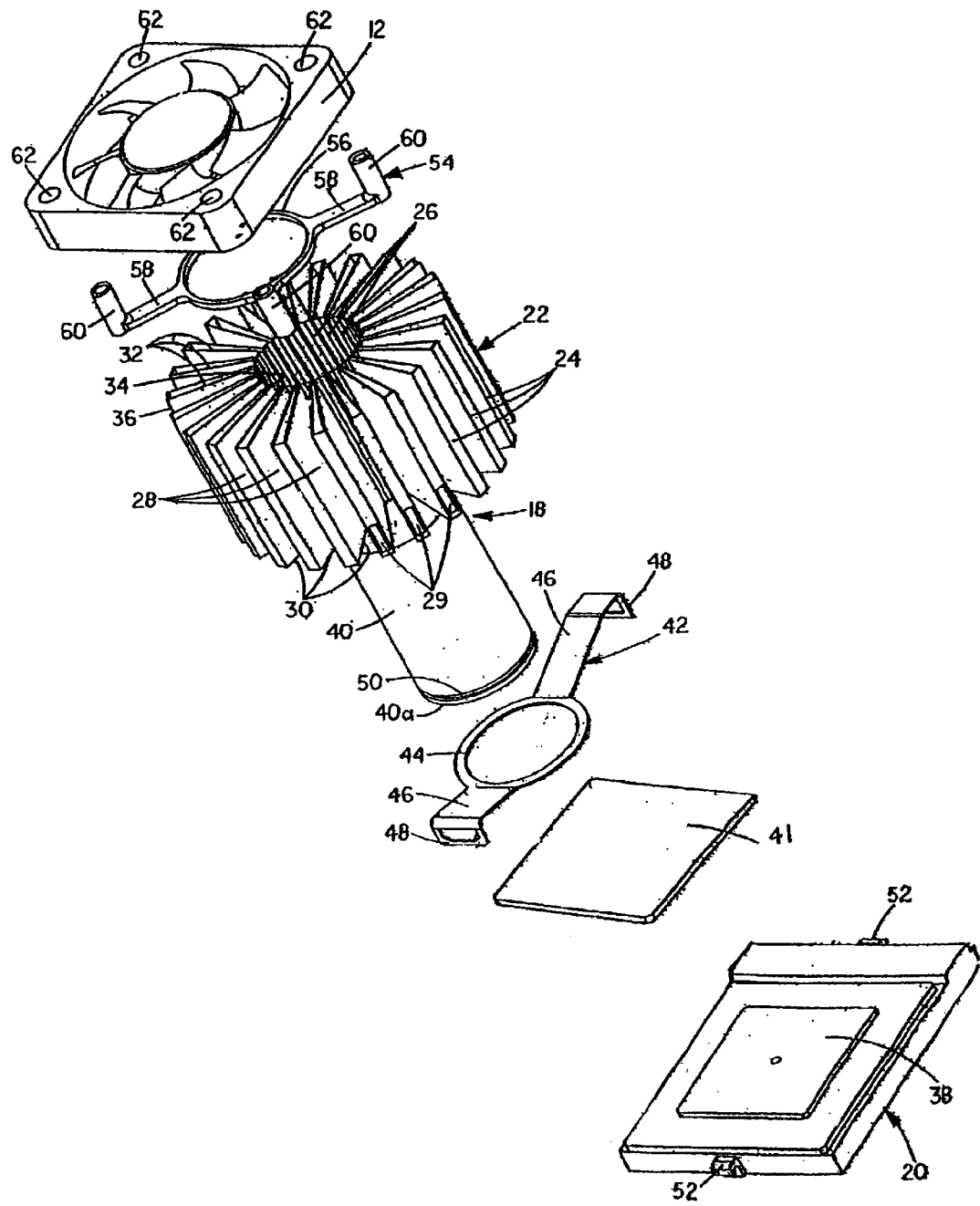
FIG. 3 is an exploded perspective view of the heat exchanger assembly of FIG. 1 including a base plate.

A spring bracket, generally designated 42 (FIGS. 2 and 3), may be used to mount the heat sink assembly 10 to the electronic device to be cooled. The spring bracket 42 includes a center ring portion 44 and a pair of diametrically disposed arms 46 terminating in apertured latch hooks 48. Ring portion 44 snaps into a circular peripheral groove 50 about the rod spaced from the bottom of rod 40. Apertured latch hooks 48 at the distal ends of arms 40 snap over a pair of hooked latch bosses 52 on opposite sides of base assembly 20. Spring bracket 42 is effective, to bias a bottom end 40a of rod 40 into thermal engagement with heat generating electronic device 38. The spring bracket also is effective to space end edges 30 at the bottom end of folded sheet 22 above the base plate 41 so that fan assembly 12 circulates cooling air completely through fins 28.

A fan mounting bracket, generally designated 54 (FIG. 2), also includes a ring portion 56 which is appropriately fixed to the top end of rod 40. Four arms 58 radiate outwardly from ring portion 56 and terminate in four mounting posts 60. Appropriate fasteners (not shown) are inserted through four holes 62 in fan assembly 12 and into mounting posts 60 to hold the fan assembly onto bracket 54 which, in turn, is mounted to the top of rod 40.

Heat generated from the electronic device 38, such as microprocessors, semiconductors and the like, within base assembly 20 is conducted to the rod 40 and into heat exchanging section 22 where fins 28 dissipate the heat to the atmosphere. Fan assembly 12 causes cooler air from the atmosphere to flow between and around the fins in a heat exchanging fashion.

Heat sink assembly 10 may also include a thermally conductive base plate 41 (not shown) which transfers heat to be dissipated to the rod, with the thermally conductive base plate being mounted at the bottom end 40a of rod 40, and end edges 30 of fins 28 at the bottom end of heat exchanging section 22 are located above the base plate 41. The bottom end 40a of rod 40 may be directly attached to the thermally conductive base plate 41 such as by welding, brazing or epoxy, or the rod 40 and base plate 41 may comprise a single integral structure.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A heat sink assembly, comprising:
    a heat exchanging section including a thermally conductive sheet folded into alternating ridges and troughs defining spaced fins having opposite end edges, said folded sheet being formed into a generally cylindrical configuration whereby the troughs form an inner segmented cylinder and the ridges form an outer segmented cylinder generally concentric with the inner cylinder; and
    a heat conductive rod within said inner segmented cylinder defined by said troughs, wherein said rod is solid.

2. The heat sink assembly of claim 1 wherein said fins are generally parallel to each other.

3. The heat sink assembly of claim 1 wherein said fins are generally parallel to said rod.

4. The heat sink assembly of claim 1, including a fan mounted on the heat exchanging section at an end thereof.

5. The heat sink assembly of claim 1 wherein at least one of the troughs contains an aperture therein.

6. A heat sink assembly, comprising:
    a heat exchanging section including a thermally conductive sheet folded into alternating ridges and troughs defining spaced fins having opposite end edges, said folded sheet being formed into a generally cylindrical configuration whereby the troughs form an inner segmented cylinder and the ridges form an outer segmented cylinder generally concentric with the inner cylinder; and
    a heat conductive rod within said inner segmented cylinder defined by said troughs, wherein said rod comprises a fluid filled heat pipe.

7. The heat sink assembly of claim 6 wherein said fins are generally parallel to each other.

8. The heat sink assembly of claim 6 wherein said fins are generally parallel to said rod.

9. The heat sink assembly of claim 6, including a fan mounted on the heat exchanging section at an end thereof.

10. The heat sink assembly of claim 6 wherein at least one of the troughs contains an aperture therein.

11. A heat sink assembly, comprising:
    a heat exchanging section including a thermally conductive sheet folded into alternating ridges and troughs defining spaced fins having first and second end edges, said folded sheet being formed into a generally cylindrical configuration whereby the troughs form an inner segmented cylinder and the ridges form an outer segmented cylinder generally concentric with the inner cylinder;
    a thermally conductive base plate above which the heat exchanging section is mounted, with the first end edges of the fins of the cylindrically configured folded sheet being between the base plate and the second end edges of the fins; and
    a cylindrical heat conductive rod within said inner segmented cylinder defined by said troughs, wherein one end of said rod is in engagement with the thermally conductive base plate, the rod and the thermally conductive base plate constituting a single, integral structure.

12. The heat sink assembly of claim 11, including a fan mounted on the heat exchanging section at an end thereof.

13. The heat sink assembly of claim 11 wherein said fins are generally parallel to each other.

14. The heat sink assembly of claim 11 wherein said fins are generally parallel to said rod.

15. The heat sink assembly of claim 11 wherein at least one of the troughs contains an aperture therein.

16. A heat sink assembly, comprising:
    a heat exchanging section including a thermally conductive sheet folded into alternating ridges and troughs defining spaced fins having first and second end edges, said folded sheet being formed into a generally cylindrical configuration whereby the troughs form an inner segmented cylinder and the ridges form an outer segmented cylinder generally concentric with the inner cylinder;
    a thermally conductive base plate above which the heat exchanging section is mounted, with the first end edges of the fins of the cylindrically configured folded sheet being between the base plate and the second end edges of the fins; and
    a cylindrical heat conductive rod within said inner segmented cylinder defined by said troughs, wherein said rod is solid.

17. The heat sink assembly of claim 16 wherein one end of said rod is in engagement with the thermally conductive base plate.

18. The heat sink assembly of claim 16 wherein said fins are generally parallel to each other.

19. The heat sink assembly of claim 16 wherein said fins are generally parallel to said rod.

20. The heat sink assembly of claim 16 wherein the rod and the thermally conductive base plate constitute a single, integral structure.

21. The heat sink assembly of claim 16 wherein at least one of the troughs contains an aperture therein.

22. The heat sink assembly of claim 16, including a fan mounted on the heat exchanging section at an end thereof.

23. A heat sink assembly, comprising:
- a heat exchanging section including a thermally conductive sheet folded into alternating ridges and troughs defining spaced fins having first and second end edges, said folded sheet being formed into a generally cylindrical configuration whereby the troughs form an inner segmented cylinder and the ridges form an outer segmented cylinder generally concentric with the inner cylinder;
- a thermally conductive base plate above which the heat exchanging section is mounted, with the first end edges of the fins of the cylindrically configured folded sheet being between the base plate and the second end edges of the fins; and
- a cylindrical heat conductive rod within said inner segmented cylinder defined by said troughs, wherein said rod is a fluid filled heat pipe.

24. The heat sink assembly of claim 23, including a fan mounted on the heat exchanging section at an end thereof.

25. The heat sink assembly of claim 23, wherein one end of said rod is in engagement with the thermally conductive base plate.

26. The heat sink assembly of claim 23 wherein said fins are generally parallel to each other.

27. The heat sink assembly of claim 23 wherein said fins are generally parallel to said rod.

28. The heat sink assembly of claim 23 wherein the rod and the thermally conductive base plate constitute a single, integral structure.

29. The heat sink assembly of claim 23 wherein at least one of the troughs contains an aperture therein.

* * * * *